United States Patent [19]

Samuels

[11] Patent Number: 4,609,285
[45] Date of Patent: Sep. 2, 1986

[54] WAFER SUPPORT PLATE FOR PHOTOLITHOGRAPHIC APPARATUS

[75] Inventor: Gerard Samuels, Paoli, Pa.

[73] Assignee: RCA Corporation, Princeton, N.J.

[21] Appl. No.: 770,977

[22] Filed: Aug. 30, 1985

[51] Int. Cl.⁴ .............................................. G03B 27/62
[52] U.S. Cl. ......................................... 355/75; 355/53
[58] Field of Search ...................... 355/75, 125, 53, 54, 355/43, 67; 269/21, 54.4, 289 R, 296, 54

[56] References Cited

U.S. PATENT DOCUMENTS 3,711,081  1/1973  Cachon ................................. 269/21
4,348,105  9/1982  Caprari ................................. 355/67

OTHER PUBLICATIONS

Article in *Electronics*/Oct. 23, 1980, pp. 105–108.

*Primary Examiner*—Richard A. Wintercorn
*Attorney, Agent, or Firm*—Birgit E. Morris; Donald S. Cohen

[57] ABSTRACT

Defocusing effects by undesired wafer tilt caused by photoresist debris in prior art photolithographic apparatus are substantially eliminated by a novel plate for supporting a wafer to be imaged without generating debris. Three tabs are provided along the periphery of an aperture in the plate. Each tab is provided with a spherical body, such as a ball, precisely positioned in a predetermined plane, and arranged to contact the wafer at a tangent to the surface of the spherical body. Relative movement while loading the wafer in the apparatus with respect to the supporting balls causes substantially no discernible debris from the wafer surface material. Imaging defects on the wafer due to photoresist debris are also substantially eliminated by the apparatus.

9 Claims, 6 Drawing Figures

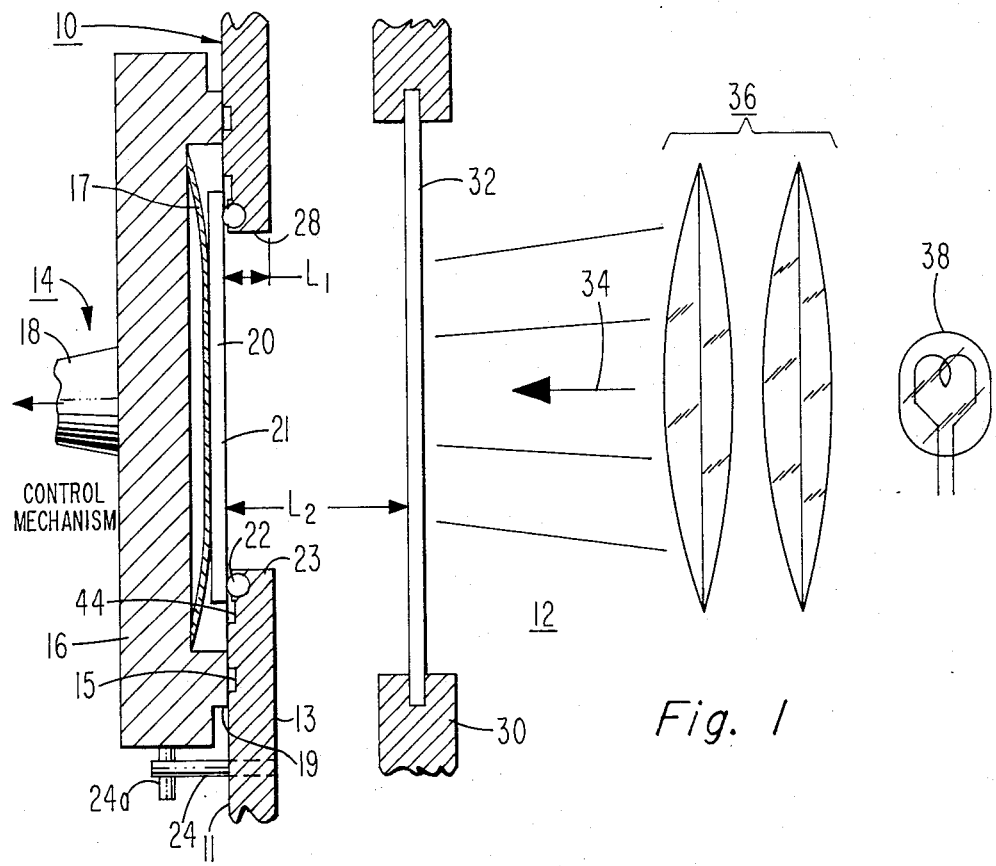
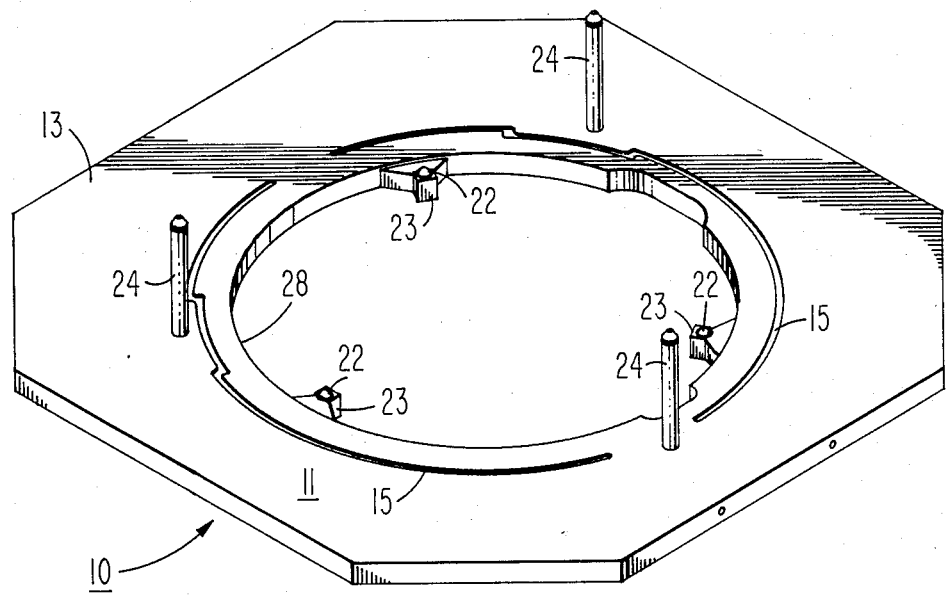
Fig. 1
Fig. 2

WAFER SUPPORT PLATE FOR PHOTOLITHOGRAPHIC APPARATUS

This invention relates to a wafer support plate, particularly to a wafer support plate for use in photolithography apparatus in which a wafer is aligned with respect to a mask by linear and tilting positioning movements.

BACKGROUND OF THE INVENTION

During the processing of a semiconductor wafer to its ultimate finished product as an integrated circuit device or chip, there are many photolithographic steps used to develop patterns in the wafer. As the size of the wafer topography becomes smaller and smaller, wherein the linewidths are on the order of several micrometers, if not in submicrometer dimensions, the photolithography processing steps become significantly important to provide very precise alignment, positioning and focusing of the wafer relative to the mask within the photolithography equipment.

Conventional apparatus for supporting wafers provided with photoresist material during the photolithography steps are known to generate debris of photoresist material from the wafer surface during the loading and unloading steps of the wafer onto and from a wafer support plate of the apparatus. In particular, in one form of apparatus finger-like supports or tabs are provided to be pressed against the photoresist surface of the wafer to hold it in position within a generally circular cut-out of the wafer support plate through which a mask image is projected. The support tabs can and often do cause photoresist debris (1) by impact when the wafer holding chuck assembly of the apparatus pushes the wafer against the tabs, and (2) by a rubbing movement between the wafer surface and the support tabs when the wafer is withdrawn from the support plate. Accumulated debris collected on the tab surface can result in an image generated by the mask on the wafer to be out of focus by alteration of the focal plane on portions if not the entire wafer surface. This results in poor image definition and loss of control of critical spacing and linewidth dimensions, particularly dimensions in the micron and submicron range. Moreover, the loss of dimension control results in low yield of product wafers which either must be discarded or reworked.

It is important in this field to provide a wafer support plate that reduces, if not eliminates, the generation of photoresist material debris from wafers during the photolithographic alignment and focusing steps.

SUMMARY OF THE INVENTION

According to the present invention, a plate is provided for supporting a wafer in an imaging position relative to a mask for processing in a photolithographic apparatus. The plate has three tabs disposed along the periphery of a wafer-receiving aperture in the plate. Each tab carries a substantially spherical body having a smoothly curved surface arranged to contact the wafer at the tangent to the surface of the body. The three spherical bodies are positioned to be fixed in a predetermined common plane that precisely defines the focal imaging plane on the wafer surface. Relative movement of the wafer while supported against the three fixed spherical bodies, as by the movement resulting from loading and unloading the wafer relative to the support plate, causes substantially no discernible debris from the surface of the wafer.

The three spherical bodies of the plate are precisely positioned in the predetermined common plane by each body being inserted in a respective aperture of each tab to contact a precisely flat plate and then be bonded in that position.

BRIEF DESCRIPTION OF THE DRAWING

FIG. 1 is a schematic of a photolithographic apparatus useful in the practice of the present invention;

FIG. 2 is a view in perspective of the wafer support plate embodying the present invention;

DETAILED DESCRIPTION OF THE PREFERRED EMBODIMENT OF THE INVENTION

Figure 3:
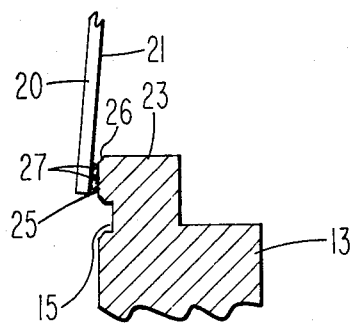
FIG. 3 is a fragmentary portion of a prior art support plate illustrating the wafer support tab supporting a wafer.

As shown in FIG. 1, a wafer support plate assembly 10 of the present invention is typically used in a photolithographic apparatus 12. See FIG. 2 for a perspective view of the assembly 10. The apparatus 12 may be, for example, a Perkin-Elmer photolithographic apparatus, Micralign Model 230/HT. Apparatus 12 comprises a wafer positioning means 14, including a wafer holding chuck assembly 16 provided with suitable vacuum holding means (not shown), to orient and hold a wafer 20 in a precise plane. The chuck assembly 16 of means 14 is carried by a positioning arm 18 coupled to a control mechanism (not shown) of the apparatus 12. The positioning means 14 transports the wafer 20 from a source (not shown) for placement against the plate assembly 10 carrying three substantially spherical bodies, such as steel balls 22, each supported by a tab 23. A spring 17 is positioned within a recess of the assembly 16 to hold the wafer 20 in position against the three balls 22 with a spring bias of about 8 oz.

Plate assembly 10 is provided with three alignment pins 24 on the surface 11 of a plate 13 which slide into contact with a respective one of three mutually perpendicular alignment pins 24a on the chuck assembly 16. The wafer 20 can thus be positioned and aligned precisely within an aperture 28 of the plate 13.

A plane resting on the three balls 22 will be coplanar with the surface 11 of plate 13. Plate 13 is precisely flat. Thus, the photoresist surface 21 of a wafer 20 placed against the balls 22 will also be coplanar with the surface 11, as will be further explained. The surface of an annular ring portion 19 of assembly 16 covers a portion of surface 11 provided with a pair of arcuate vacuum channels 15 suitably connected to a vacuum source (not shown) to hold the chuck assembly 16 in position integral with the plate assembly 10 for both the alignment steps and the imaging steps.

A mask holder 30 is provided to support a mask 32 which, in turn, is used in a conventional sense to receive a beam 34 of exposure light via projection imaging optics such as condensing lens 36. A field lens (not shown) is typically positioned between the mask 32 and wafer 20. A light source 38 provides the beam 34.

In operation, a wafer 20 is suitably positioned on the chuck assembly 16 carried by the positioning arm 18. The positioning means 14 is operated to position the wafer 20 within the aperture 28 against the three balls 22. The alignment pins 24 are oriented to be in slidable contact with the three mutually and respectively perpendicular alignment pins 24a located on the chuck assembly 16 to provide for accurate registration and alignment of the chuck assembly 16 with respect to the plate 13. Distance $L_1$ is the spacing from the front face of assembly plate 11 to the surface 21 of the wafer 20 and should be less than the length $L_2$ in a projection imaging system. The control positioning means 14 includes means (not shown) for aligning and tilting the wafer 20 relative to the mask 32 so that the image of the mask 32 will be precisely located on the wafer 20 by the distance $L_2$. The mask 32 and wafer 20 are thus precisely parallel to each other. The desired orientation of the wafer 20 over the plate aperture 28 relative to the mask 32 is achieved by X and Y movement and/or $\theta$ (tilt) rotation of the wafer 20 while being pressed against the balls 22 with a spring force of about 8 ounces. Any misalignment in tilt (that is, non-parallelism) between the wafer 20 and mask 32 is corrected by appropriate tilting of the wafer 20 by the positioning means 14.

After alignment and positioning, the wafer 20 is then imaged. The apparatus 12 is then operated to withdraw the imaged wafer 20 by releasing the vacuum to thus allow for separation from the plate 10. The wafer 20 is then transported for replacement by a subsequent wafer 20 for repeating the cycle. Since the mechanism of the positioning means 14 is of conventional form, it consists of no part of the present invention and is therefore not being described in any further detail.

The present invention overcomes a significant problem that occurs very frequently in conventional photolithographic apparatus as will now be explained. Reference is made to FIG. 3 showing a prior art tab 23 in engagement with a wafer 20. For fine dimension imaging the wafer 20 must be precisely positioned within the apparatus 12 for the imaging step, within a depth of focus of about ±5 micrometers. Any debris 27 (FIG. 3) settling or collected on the contact area portions of the three prior art tabs 23, when placed against the wafer 20, will cause an image from the mask 32 upon the wafer 20 to be completely or partially out of focus by the tilt of the wafer 20 relative to the surface 25 of the tab 23, as shown in exaggeration in FIG. 3. Such defocusing effects results in poor definition and loss of critical dimension control as will be understood by those skilled in the art.

The root cause of the problem causing defocusing will be better understood from the following explanation. Each wafer 20 is typically coated on its surface 21 with an extremely thin coat of brittle material, such as photoresist material. The thickness of such photoresist material is typically about one micrometer. The photoresist material, being quite brittle, can break up into small crystals when impacted. When the surface 21 of the wafer 20 carrying the photoresist material is impacted by the prior art tabs 23, particles (what are termed herein as "debris") of the photoresist material resulting from the impact can be dislodged from the surface 21. The prior art tabs 23 shown in FIG. 3, it should be understood, are not provided with a spherical ball 22, according to the assembly 10 as shown in FIG. 2 described hereinabove. The flat face 25 of each prior art tab 23 has a bevel 26. Relative movement of the tab 23 with respect to the wafer surface 21 tends to abrade or cut into the surface 21 of the photoresist material. It is believed that the edges at the bevels 26, or the tab face 25 or both the edges and face 25, contribute to this abrasive or cutting action. As a result of this abrasion and cutting action, in addition to the initial impacting action of the tabs 23 against the photoresist surface 21 of the wafer 20, debris 27 therefrom tends to collect on the tab face 25. Repeated use of the positioning means 14 on subsequent wafers 20 can create a large collection or accumulation of such debris 27 on the tab face 25. As the debris accumulation increases, more and more misalignment of the wafer 20 on the three tabs 23 results in more and more defocusing of the wafer image on the wafer 20 from the mask 32.

Moreover, debris from the portion of the wafer 20 adjacent the tabs 23 may drop over inner surface portions to cause defects in the imaging step.

The present invention, utilizing a spherical ball 22 fixed in each respective tab 23, provides essentially a non-abrasive and non-cutting point contact of the balls 22 on the wafer surface 21 and thereby reduces, if not eliminates, debris 27 significantly. Moreover, the balls 22 reduce impact effects by the action of merely deforming the resist surface without ablating material therefrom. In addition, since the surface of the balls 22 is curved, any debris will tend to be shed therefrom. Many repeated uses of apparatus embodying the invention have shown a very marked improvement in the quality of wafers processed by the photolithographic apparatus 12 provided with assembly 10.

I will now describe the method by which I provide the prior art tabs (23) of a conventional wafer holder plate assembly with the spherical bodies (22) in a precise predetermined planar arrangement.

Figure 4:
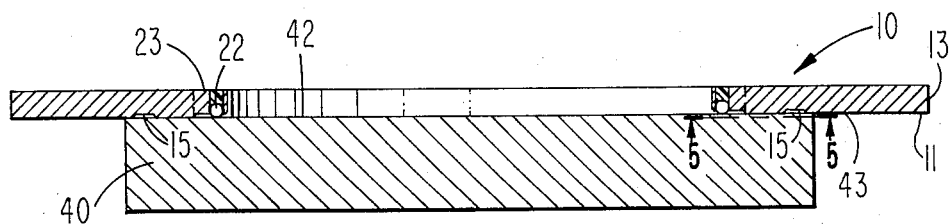
FIG. 4 is a sectional view of the wafer support plate shown in FIG. 2 in cooperative relation with a precisely flat plate used in making the wafer support plate of the present invention.
Figure 5:
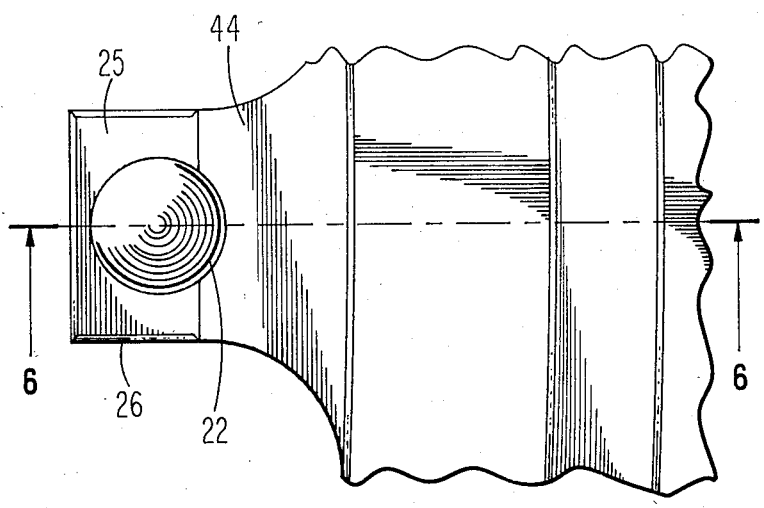
FIGS. 5 and 6 are enlarged sectional views of the tab of the support plate carrying steel balls used in the support plate of the present invention as seen along viewing lines 5—5 and 6—6 of FIGS. 4 and 5, respectively.

An alignment plate 40, as shown in FIG. 4, is positioned to support a wafer support plate assembly 10 without spherical balls such that the face 11 of plate 13 faces a precisely lapped surface 42 of the alignment plate 40. In the preferred embodiment now being described, plate 40 is 4.75 inches in diameter and 0.75 inch thick. It is formed of an oil-hardening (0-1) tool steel disc hardened to Rockwell "C"-50 and stress relieved and then ground flat with a 60H aluminum oxide grinding wheel to a 16 finish. Plate 40 is then lapped according to conventional techniques to an optically determined flatness of one wavelength ($\lambda$) of a helium source light, namely, a wavelength ($\lambda$) of 0.000016 inch. The lapped surface 42 is thus essentially flat.

The prior art tabs 23 of the assembly 10, prior to being positioned over the plate 40, as shown in FIG. 4, are modified in the following manner to receive the three steel balls 22. Each of the steel balls 22 in one embodiment has a diameter of 0.09375±0.00005 inch. The three balls 22 are each formed preferably of No. 440 hardened stainless steel, which material as known is advantageously hardenable. For some applications ordinary magnetic steel may be used instead. However, stainless steel is essentially non-corrosive and is therefore preferred. The flat surfaces of the tabs 23 are ground back 0.010 inch with a tolerance of plus 0.000 and minus 0.005 inch to provide the surface portion 44 shown in FIG. 6. A clear-through aperture 46 is drilled into the surface 44 with a diameter of 0.096 inch.

Figure 6:
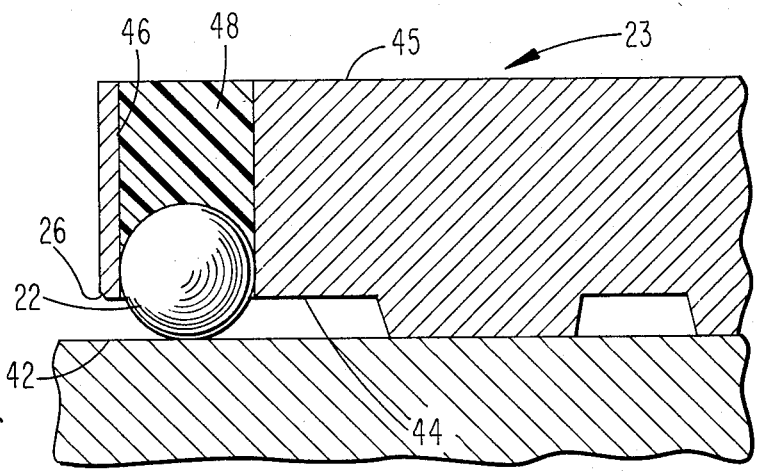

With the assembly plate 10 so prepared with the tabs 23 ground back along the surface 44 and the clear-through aperture 46 provided therein, the wafer support plate assembly 10 is then positioned over plate 40, as shown in FIG. 4. A steel ball 22 is then inserted at face 45 of tab 23 into a respective aperture 46 until each ball 22 makes solid contact at a tangent with the plate surface 42. The balls 22 should have a tight fit within the aperture 46 according to the dimensions given above. Each ball 22 is inserted with sufficient force to be pushed through the aperature 46 and to assure contact with the surface 42 as seen in FIG. 6. The tight fit of the ball 22 within the aperture 46 assures very little leakage around the surface of the ball 22. Procedures are followed, as will be explained, to determine the accuracy of the position of each ball within the predetermined plane required to assure that the wafers to be imaged are in a proper focal plane.

Each of the aperatures 46 is then filled with an epoxy adhesive system 48 of sufficient viscosity to fill the aperture 46 so as to cover completely the exposed surface of the ball 22 within the aperture 46 and to thereby keep it in the precise contact position. A suitable epoxy adhesive system 48 is comprised of the following proportion of constituents: 100 grams of bis-phenyl-A epoxy resin, to which is added 10 grams of amine catalyst, such as DETA (diethylene triamine) and to which is added 30 grams of alumina filler in powder form ($Al_2O_3$). The mixture formulating the adhesive system 48 is applied to each aperture 46 as described above.

To assure that there are no air bubbles within the adhesive system 48, a probe, such as a toothpick, is used to stir the adhesive 48 in situ sufficiently to assure that no air bubbles remain therein. It may be desirable, if excessive air bubbles tend to collect, that the adhesive mixture 48 be heated to drive off air bubbles from the mix. Thereafter the assembly 10, as shown in FIG. 4, is allowed to rest in the ambient, without necessarily heating it, for about no less than 24 hours to assure thorough curing of the epoxy adhesive system 48. After the cure period has passed the assembly 10 is then ready for use in the apparatus 12 as shown in FIG. 1.

It should be understood that by the procedure to make the assembly 10 as just described, a plane tangential to the balls 22 will be in a precise coplanar relation with surface 11. Thus, when the balls 22 are in contact at a tangent with the surface 21 of the wafer 20, wafer 20 will be in a precisely coplanar position with the balls 22. Any movement of the wafer surface 21 relative to the contacting portion of the balls 22 that would otherwise cause scratching or abrading of the photoresist material on the wafer 20 in prior art apparatus (FIG. 3) is obviated according to the present invention.

In order to determine that the three balls 22 are in a precise predetermined plane, a conventional indicator gauge is used to measure the precise elevations differentiations of each ball 22, with respect to the surface area 11 of plate 13 adjacent the ball. In several examples in the use of the invention, such measurements were made over a period of several days to be sure that the balls 22 remained in a precise position indicating that the epoxy system 48 was fully cured. Such measurements showed that the difference in elevations was no greater than 5 microns. In apparatus 12 used in the practice of the invention, the depth of focus of the lens system 13 is only ±5 μm (±0.0002 in.). Accordingly, with the measurements by the indicator gauge determining the relative elevation of the balls 22 to the surface 11 to be less than 5 microns, the coplanar accuracy of the three balls was quite acceptable. Use of the assembly 10 thereafter showed accurate focusing and no apparent debris 27 on the balls 22.

An aid to determine the precision of the coplanarization of the three balls 22 relative to the surface 11 is by noting the adequacy of the vacuum developed in channels 15 to hold a perfectly flat mirror in place against the surface 42. If the mirror is not held in position due to an inadequate vacuum, the coplanarization of the balls 22 to the surface 11 is considered to be not adequate.

Use of the assembly 10 made according to the present invention, provided processed wafers 20 with significantly high yields.

While the present embodiment of the invention is described for use in a projection system, it will be understood that the invention can be used in a proximity imaging system. Moreover, either refractive or reflective imaging optics may be used as desired.

What is claimed is:

1. In a photolithographic apparatus, a plate for supporting a wafer in an imaging position relative to a mask for processing in the apparatus, said wafer having a surface comprising brittle material, said plate having three tabs disposed within the peripheral surface of an aperture in said plate, each tab having a hole within which is positioned a body having a smoothly curved surface, each of said bodies being arranged to contact tangentially a surface portion of said wafer whereby relative movement of the wafer and said tabs causes substantially no discernible abrasion of material from the surface of the wafer.

2. The apparatus of claim 1 wherein said body is a sphere.

3. A method for fabricating a wafer support plate for supporting a wafer in a photolithographic apparatus, said plate having an aperture to receive a wafer, said plate further having three tabs spaced from each other within the periphery of the aperture, said tabs serving to be pressed against the surface of a wafer to hold the wafer in position within said plate aperture, comprising the steps of:
 (a) providing a clear through hole in each tab;
 (b) supporting said wafer support plate on a surface of a calibration plate wherein said surface is precisely flat and coplanar with respect to the surface of said support plate;
 (c) inserting a body having a curved surface in each respective hole of said tabs and pressing each said body against said precisely flat surface to establish tangential contact therewith; and
 (d) filling each tab hole with a bonding agent so that each of said bodies is fixed in position against said calibration plate.

4. The method of claim 3 wherein said bodies are spheres.

5. The method of claim 3 wherein said bonding agent is epoxy.

6. The method of claim 5 wherein said agent is agitated before it is dried to remove air pockets that may exist within said bonding agent.

7. The method of claim 6 wherein said agent is heated before it is dried to discharge any air pockets that may exist within said bonding agent.

8. The method of claim 3 further includes the step of measuring by an indicator gauge the elevation differentiation of said balls with respect to the surface of said plate.

9. The method of claim 3 further including the step of determining the coplanarization of said balls to said surface by positioning a perfectly flat mirror over said aperture and providing a vacuum to hold said mirror against said surface, the failure to establish a sufficient vacuum being indicative that the balls are not coplanar with said surface.

* * * * *